(12) United States Patent
Elias et al.

(10) Patent No.: US 10,998,032 B2
(45) Date of Patent: May 4, 2021

(54) EDRAM REFRESH APPARATUS AND METHOD

(71) Applicant: Mellanox Technologies, Ltd., Yokneam (IL)

(72) Inventors: George Elias, Tel-Aviv (IL); Hillel Chapman, Ramot Menashe (IL); Eitan Zahavi, Zichron Yaakov (IL); Elad Mentovich, Tel-Aviv (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/268,507

(22) Filed: Feb. 6, 2019

(65) Prior Publication Data

US 2020/0251161 A1    Aug. 6, 2020

(51) Int. Cl.
*G11C 11/406*    (2006.01)
(52) U.S. Cl.
CPC .. *G11C 11/40615* (2013.01); *G11C 11/40607* (2013.01); *G11C 11/40618* (2013.01)
(58) Field of Classification Search
CPC ........ G11C 11/40615; G11C 11/40607; G11C 11/40618
See application file for complete search history.

(56) References Cited

U.S. PATENT DOCUMENTS

| 4,447,873 | A | * | 5/1984 | Price | G06F 13/122 |
| | | | | | 710/53 |
| 5,317,709 | A | * | 5/1994 | Sugimoto | G11C 11/406 |
| | | | | | 365/222 |
| 5,437,042 | A | * | 7/1995 | Culley | G06F 13/24 |
| | | | | | 710/119 |
| 5,500,827 | A | * | 3/1996 | Yazdy | G06F 13/1636 |
| | | | | | 365/189.15 |
| 2008/0196048 | A1 | * | 8/2008 | Daniel | G06F 9/465 |
| | | | | | 719/331 |
| 2011/0304595 | A1 | * | 12/2011 | Holmes | H04N 5/445 |
| | | | | | 345/204 |
| 2017/0110178 | A1 | * | 4/2017 | Bains | G11C 8/12 |
| 2017/0325056 | A1 | * | 11/2017 | Mehta | H04W 4/024 |

* cited by examiner

*Primary Examiner* — Sultana Begum
(74) *Attorney, Agent, or Firm* — Kligler & Associates Patent Attorneys Ltd

(57) ABSTRACT

One or more blocks of dynamic random access memory are embedded together with a processor and a data bus on an integrated circuit. The data bus has a bandwidth b for general operation including memory access, the block of dynamic random access memory further requiring data refresh at a refresh rate r. The block thus forms an eDRAM on the integrated circuit, typically an ASIC. A refresh controller embedded with the eDRAM may control refresh by clocking the data bus at a rate higher than the rate of the data bus to accommodate both the required memory access and the required data refresh.

21 Claims, 7 Drawing Sheets

EDRAM REFRESH APPARATUS AND METHOD

FIELD AND BACKGROUND OF THE INVENTION

The present invention, in some embodiments thereof, relates to eDRAM and, more particularly, but not exclusively, to memory refresh issues arising when eDRAM is used.

Embedded dynamic RAM (eDRAM) is dynamic random-access memory (DRAM) integrated on the same die or multi-chip module (MCM) of an application-specific integrated circuit (ASIC) or microprocessor—hereinafter the integrated circuit or simply the chip. The eDRAM's cost-per-bit is higher when compared to equivalent standalone DRAM chips used as external memory, but the performance advantages of placing eDRAM onto the same chip as, for example the processor, outweigh the cost disadvantages in many applications.

DRAM's are much more area efficient than static RAM (SRAM). One of the main differences between DRAM and SRAM is the fact that DRAM requires refreshing of the bit cells (line by line) and this applies to the eDRAM so that a refresh mechanism may be built into the ASIC alongside or as part of the eDRAM. The refresh operation is usually carried out by reading the data from a specific line and writing it back. In any event, the refresh operation when the eDRAM is embedded on the chip consumes on chip bandwidth that is no longer available for memory usage.

Currently DRAM's are external devices to the chips and therefore they are limited by the memory access bandwidth they can supply. Once placed on the chip, the expected bandwidth may be greatly improved. Specifically, the performance advantages of embedding memory on the chip may be due to the ability to use much wider buses and higher operation speeds. Furthermore, the higher density of DRAM in comparison to SRAM means that larger amounts of memory can be installed on smaller chips. Chip manufacture with eDRAM may require additional fab process steps compared with embedded SRAM, which raises cost, but the greater memory density may offset the process cost when a significant amount of memory is used in the design.

eDRAM memories, like all DRAM memories, require periodic refreshing of the memory cells, and since the DRAM is embedded, additional complexity is added to the chip. The memory refresh controller may be embedded along with the eDRAM memory, allowing the remainder of the chip to treat the memory as a simple SRAM component. The present embodiments relate to refreshing issues with integrating eDRAM onto the chip. The eDRAM eDRAM refresh mechanism access the same physical memory interface, and thus takes away bandwidth relative to SRAM. Furthermore there are constraints governing frequency of refresh and the memory is not available during refresh. The constraints may be experienced as a back pressure on the data bus.

SUMMARY OF THE INVENTION

The present embodiments relate to managing the refresh process on the chip, and ensuring efficiency of bus utilization in the presence of back pressure.

According to an aspect of some embodiments of the present invention there is provided apparatus comprising:

at least one block of dynamic random access memory embedded on an integrated circuit alongside a processor and a data bus, the data bus having a bandwidth b in bus clock cycles for a given period at a given rate for required memory access, the at least one block of dynamic random access memory further requiring data refresh at a refresh rate r in bus clock cycles at the given rate; and a refresh controller, the refresh controller configured to control refresh by clocking the data bus at a rate higher than the given rate to accommodate both the required memory access and the required data refresh within the given period.

In an embodiment, the refresh controller is configured to insert clock cycles at a rate $(b+r)/b$ over the given period.

In an embodiment, the refresh controller is configured to reserve r clock cycles over the given period for data refresh.

In an embodiment, the refresh controller is configured to set and reset a flag such that the reserving clock cycles comprises setting a flag over r of cycles of the given period.

In an embodiment, the refresh controller is configured to reserve the clock cycles in a distributed manner over the given period.

In an embodiment, the flag being set makes a following slot available for memory access or prevents non-refresh bus traffic for the following slot.

In an embodiment, the refresh controller comprises a flip flop having an output state, the flag being set according to the output state.

In an embodiment, the refresh controller is configured to carry out division of the refresh rate by a sum of the refresh rate and the bandwidth to identify clock cycles for setting the flag.

Embodiments may comprise a first register storing r and a second register storing $b+r$ and a counter configured to successively subtract r from $b+r$ until reaching or exceeding zero, the apparatus configured such that upon the counter reaching or exceeding zero, a refresh is carried out, the flag is set and $b+r$ is added to the counter.

In an embodiment, the bandwidth b is variable or is unknown at a time of design of the apparatus.

In an embodiment, data entries are stored in the eDRAM and each data entry is associated with a corresponding data timeout.

In an embodiment, the eDRAM is a data cache, configured such that a data lookup that finds a data entry in the eDRAM also looks at the corresponding data timeout entry.

In an embodiment, the refresh controller is configured to prioritize any data entry found for refreshing wherein the corresponding data timeout entry indicates that the data entry is closer than a predetermined threshold to timing out.

In an embodiment, the refresh controller is configured to ignore any data entry for refresh whose corresponding data timeout entry is less than or equal to $1/r$.

In an embodiment, the refresh controller is configured not to carry out a refresh for any data entry wherein the data timeout entry is smaller than the refresh rate.

In an embodiment, the data cache associated with a configurable database, and data entries therein are database entries of the configurable database.

Embodiments may include an interrupt for assertion when a database entry in the cache approaches a timeout and a reserved refresh slot is not available, assertion of the interrupt causing a refresh of the entry.

According to a second aspect of the present invention there is provided apparatus comprising:

at least one block of dynamic random access memory and application specific logic integrated together on an integrated circuit alongside a data bus, the at least one block of dynamic random access memory further requiring data refresh; and a refresh controller for controlling the data refresh, wherein data entries are stored in the eDRAM and each data entry is associated with a data timeout entry, the apparatus configured such that a data lookup operation that finds a data entry in the eDRAM also looks at the corresponding data timeout entry.

According to a third aspect of the present invention there is provided apparatus comprising:

at least one block of dynamic random access memory embedded on an integrated circuit alongside application-specific logic and a data bus, the data bus having a bandwidth b in bus clock cycles for a given period at a given rate for required memory access, the at least one block of dynamic random access memory further requiring data refresh at a refresh rate r in bus clock cycles at the given rate, wherein data entries are stored in the eDRAM and each data entry is associated with a data timeout entry;

a refresh controller, the apparatus configured such that a data lookup operation that finds a data entry in the eDRAM also looks at the corresponding data timeout entry, the refresh controller being configured to limit the data refresh by ignoring any data entry for refresh whose corresponding data timeout entry is less than or equal to $1/r$.

According to a fourth aspect of the present invention there is provided apparatus comprising:

at least one block of embedded dynamic random access memory (eDRAM), the eDRAM embedded in an integrated circuit alongside a processor and a data bus, the at least one block of dynamic random access memory further requiring data refresh at a refresh rate, wherein data entries are stored in the eDRAM and each data entry is a database entry and is associated with a data timeout entry;

a refresh controller, and an interrupt, the apparatus configured such that a data lookup operation that finds a database entry in the eDRAM also looks at the corresponding data timeout entry, the refresh controller being configured to control refresh by asserting the interrupt to refresh the database entry when a database entry approaches a timeout and a reserved refresh slot is not available, the assertion of the interrupt causing a refresh of the entry.

According to a fifth aspect of the present invention there is provided a method for refresh control for embedded dynamic random access memory, the embedded dynamic random access memory comprising at least one block of dynamic random access memory embedded on an integrated circuit alongside a processor and a data bus, the data bus having a bandwidth b in bus clock cycles for a given period at a given rate for required memory access, the at least one block of dynamic random access memory further requiring data refresh at a refresh rate r in bus clock cycles at the given rate;

the method comprising clocking the data bus at a rate higher than the given rate to accommodate both the required memory access and the required data refresh within the given period.

The method may comprise:

inserting clock cycles at a rate $(b+r)/b$; and reserving r clock cycles over the given period for data refresh.

The method may comprise setting and resetting a flag such that the reserving clock cycles comprises setting a flag over r bus slots over the given period.

The method may comprise reserving the clock cycles in a distributed manner over the given period.

In the method, the flag being set may make a following slot available for memory access or may prevent non-refresh bus traffic for the following slot.

The method may comprise carrying out division of the refresh rate by a sum of the refresh rate and the bandwidth to identify clock cycles for setting the flag.

The method may comprise:

storing r and b+r;

successively subtracting r from b+r until reaching or exceeding zero, upon the subtracting reaching or exceeding zero, carrying out a refresh operation and then setting the flag and adding b+r to the subtraction result.

The method may comprise storing data entries in the eDRAM, and associating each data entry with a data timeout entry.

The method may comprise dismissing any data entry that times out according to the data timeout entry prior to being refreshed.

The method may comprise dismissing any data entry wherein the time that has elapsed since the last refresh is larger than a required refresh period.

The method may comprise not refreshing any data entry whose data timeout entry is smaller than the refresh rate.

In the method the eDRAM is a data cache, and: for each data lookup in the data cache the method may find the corresponding data timeout entry. Then, if the corresponding data timeout entry indicates that the data entry is closer than a predetermined threshold to timing out then the method may prioritize the respective data entry for refresh.

In an embodiment, the data cache is associated with a configurable database, and data entries therein are database entries. The method may assert an interrupt when a database entry approaches a timeout and a reserved refresh slot is not available. In such a case assertion of the interrupt may cause a refresh of the entry.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

DESCRIPTION OF SPECIFIC EMBODIMENTS OF THE INVENTION

Figure 1:
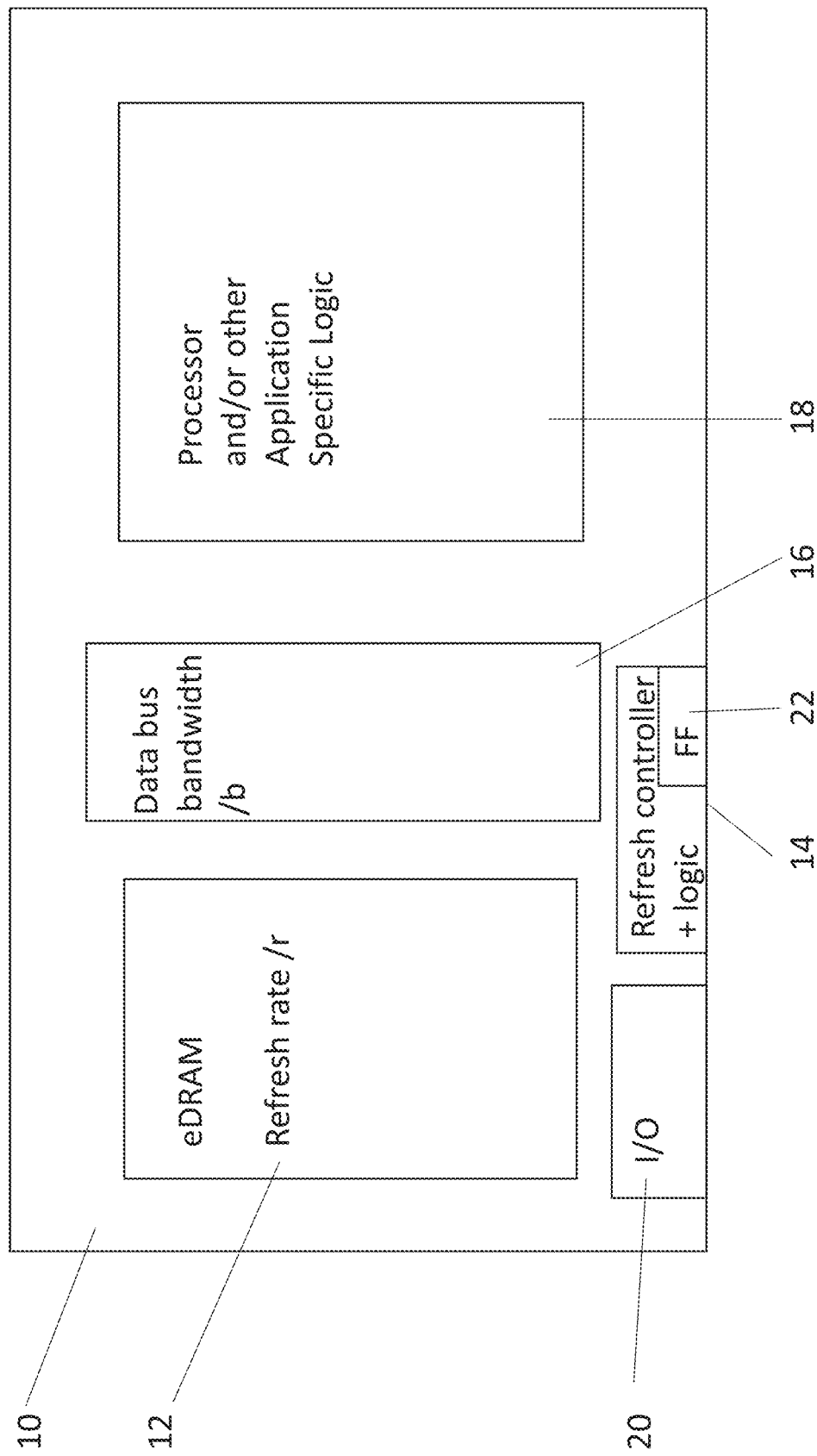
FIG. 1 is a simplified block diagram showing an integrated circuit such as an ASIC with embedded DRAM and a refresh controller according to embodiments of the present invention.

The present invention, in some embodiments thereof, relates to eDRAM and, more particularly, but not exclusively, to the refresh issues that arise when eDRAM is placed on a chip or die.

One or more blocks of dynamic random access memory are embedded together with a processor and/or other application specific logic and a data bus on an integrated circuit. The data bus has a bandwidth b for general operation including memory access, the block or blocks of dynamic random access memory further requiring data refresh at a refresh rate r. The block or blocks of dynamic random access memory thus forms an eDRAM on the integrated circuit, typically an ASIC. A refresh controller embedded with the eDRAM may control refresh by clocking the data bus at a rate higher than the rate of the data bus to accommodate both the required memory access and the required data refresh.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 illustrates a generalized integrated circuit or chip 10 such as an application specific integrated circuit (ASIC) which has on board or embedded dynamic random access memory (eDRAM) 12 and a refresh controller 14. The eDRAM 14 requires a refresh rate of r for guaranteed operation. The circuit has a data bus 16 which gives a bandwidth of b in slots per second or any other unit of time as desired. The refresh rate r is measured in the same way as the bandwidth. The circuit has application specific logic 18 and typically also includes an input output unit 20. Other units may be present according to the specific application.

The eDRAM may be in the form of one or more blocks and the eDRAM and the processor/application specific logic, herein referred to simply as processor, are integrated together on the semiconductor die together with the data bus and the refresh controller and any other components that may be needed.

In embodiments, the refresh controller controls the refresh and may direct an increase in the rate of clocking of the data bus to a rate higher than that needed for the bus bandwidth b, and thus to accommodate both the required memory access and the required data refresh for any given period. Thus if b cycles per second are needed for the bus bandwidth and r cycles per second for refresh, then the refresh controller ensures that the bus is clocked at a rate not less than b+r, to provide at least b+r time slots per second. Of these b+r slots, r slots are reserved for refresh operations.

In an embodiment, the refresh controller 14 may set and reset a flag to indicate whether the slot is available for general use or whether the slot is reserved for refresh. The slot may be reserved by the flag being set, or alternatively, the flag being set may indicate availability for general use.

Slots at any stage may be reserved for refresh but for better operation it is desirable to reserve the clock cycles in a distributed manner over any given period. The refresh controller may include a flip flop 22 whose output state may define the flag.

In an embodiment the refresh controller may carry out division, by successive subtraction, of the refresh rate r by the sum of the refresh rate and the bandwidth (b+r) to identify clock cycles for setting the flag.

Thus the refresh controller may have a first register storing r and a second register storing b+r and a counter that successively subtracts r from b+r until reaching or extending beyond zero. As the counter reaches or passes zero the flag is set to include a refresh slot, and then b+r is added to the counter for a new division. Thus r evenly distributed refreshes are provided over a time period of (b+r).

Figure 2:
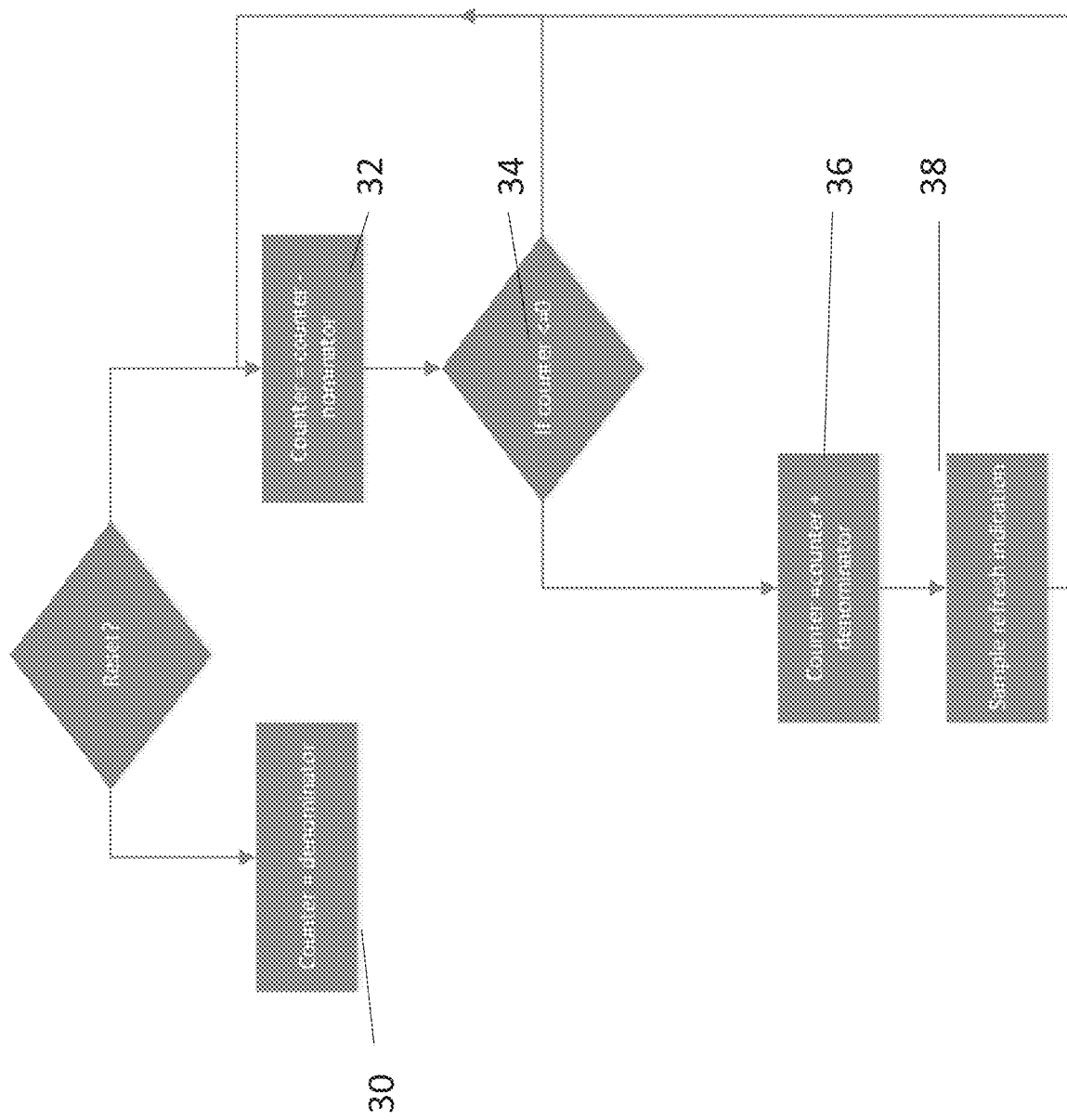
FIG. 2 is a simplified flow chart showing a process for using division by subtraction to provide a required number of refresh slots evenly distributed between general use slots according to an embodiment of the present invention.

An exemplary cycle is shown in FIG. 2, which is a flow chart showing a procedure for dividing r by b+r using successive subtraction. A counter is set to b+r in 30 and then r is subtracted once for each clock cycle in 32. Box 34 indicates testing whether the counter has reached or passed zero. If not then the successive subtractions continue, box 32, but if so then b+r is added back to the counter in box 36 and the flag is set to reserve the following slot for a refresh operation 38.

The bandwidth b may be a variable, that is to say the ASIC or other integrated circuit may be designed for different clock rates.

More generally, the refresh apparatus may be designed separately from the application specific part of the integrated circuit. For example ASIC designers may use a predesigned refresh module, say provided as an eDRAM wrapper, and add that to their application specific design. In either case, the eventual data bus clock rate b may be unknown to the designer of the refresh apparatus and thus the refresh apparatus may be designed to accept and work with a wide range of clock rates and bandwidths.

Figure 3:
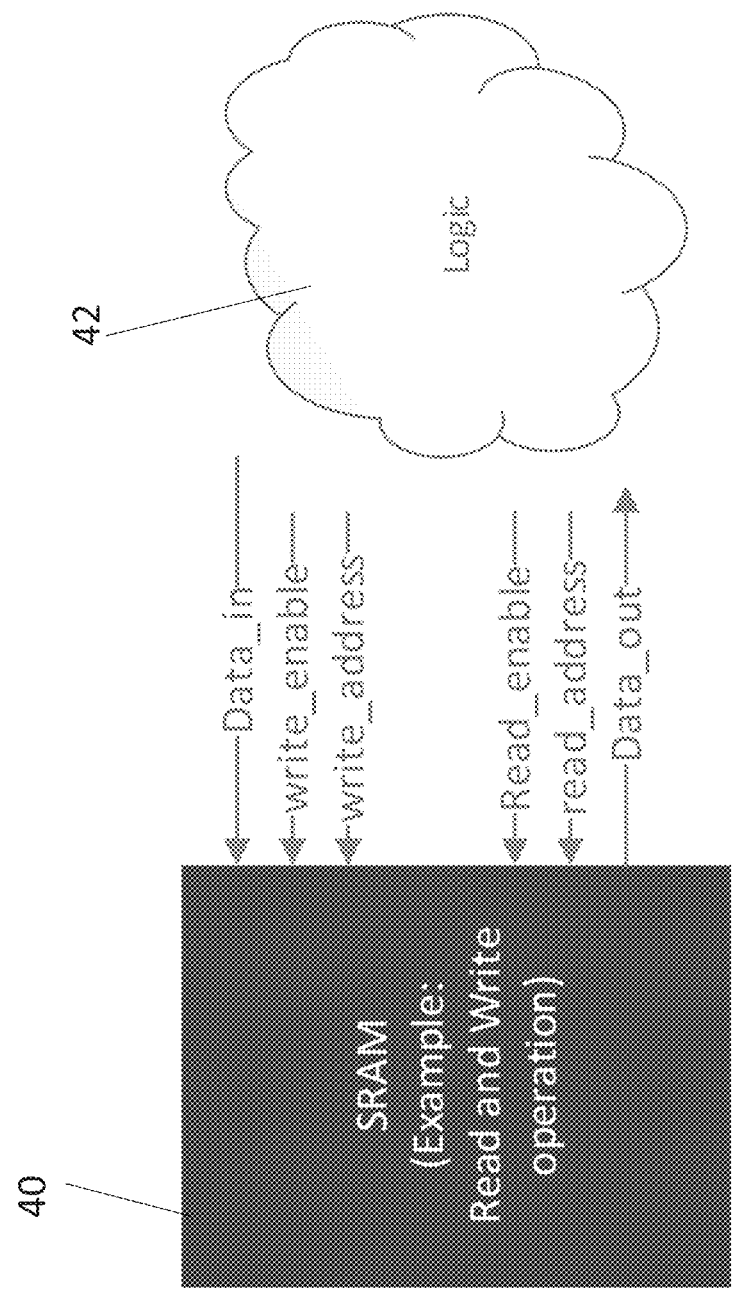
FIG. 3 is a simplified diagram showing memory read and write to a static RAM according to the known art.

Reference is briefly made to FIG. 3 which shows typical read and write operations with a static RAM 40. The static RAM 40 may be embedded on the ASIC or may be external. A write operation requires a write enable signal that sets the SRAM to write mode, an address signal that opens an address to write the data, and the write data itself. A ready operation is similar. A read enable sets the SRAM to read, an address is input and the data at the indicated address is read out. The read and write operations are controlled by logic 42.

Figure 4:
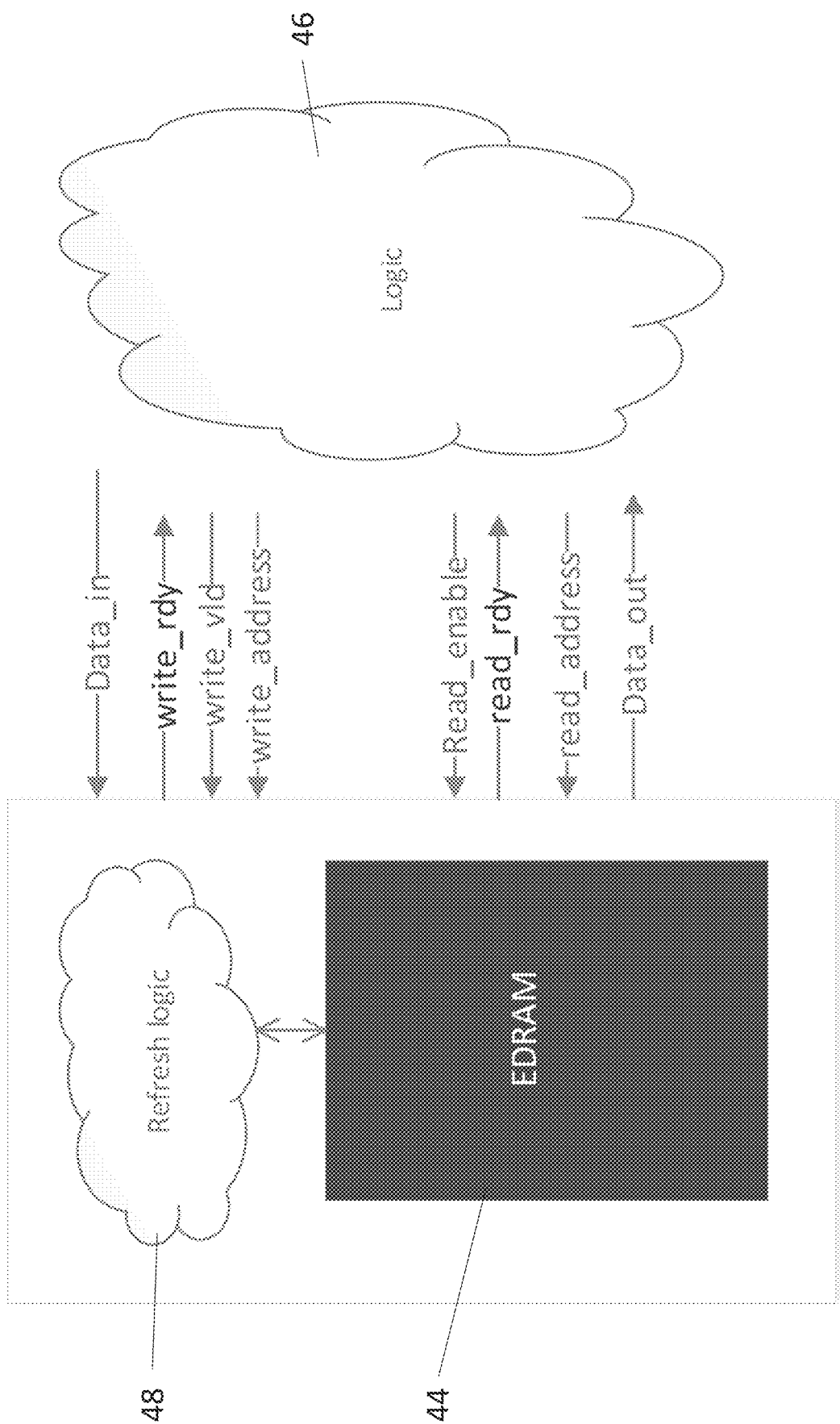
FIG. 4 is a simplified diagram showing memory read and write to an eDRAM according to embodiments of the present invention.

FIG. 4 illustrates the equivalent situation for the embedded DRAM, eDRAM 44 according to the present embodiments under the control of logic 46. As explained, the eDRAM 44 requires refreshing, under refresh logic 48, and the refresh requires time slots which therefore are not available for read and write operations. Thus the read and write operations have additional read ready and write ready signals which can only be asserted when the refresh flag is not active.

The eDRAM may be used in activities that have time sensitive data and/or data whose importance may be gauged by how often it is accessed. In such cases data entries made into the eDRAM may have associated time stamps and/or activity indicators. In the prior art it is common to refresh all data in strict order and to mark data as obsolete according to varying criteria so that say a data cache contains data most likely to be wanted in the near future. The present embodiments provide ways of monitoring the freshness of the data in association with the refresh activity so as to prioritize refresh of important data and to avoid unnecessary refresh operations. Thus the demand by refresh activity on the data bus may be reduced without reducing the currency of the data.

Figure 5:
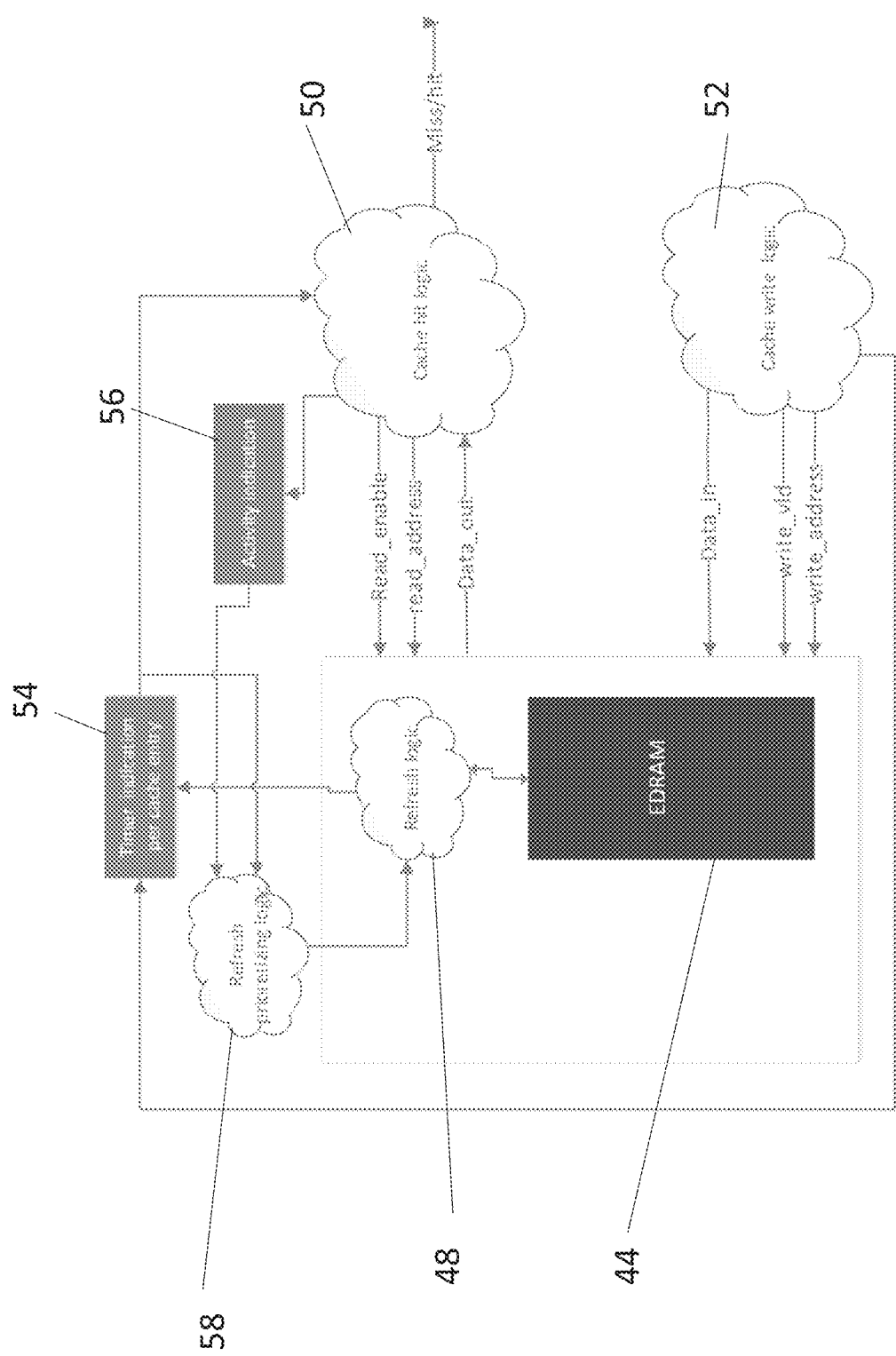
FIG. 5 is a simplified block diagram showing apparatus for prioritizing refresh according to embodiments in which the eDRAM is used as a cache.

Reference is now made to FIG. 5, which shows the eDRAM of FIG. 4 with additional logic for implementation as a data cache with controlled refresh as outlined above in accordance with a further embodiment of the present invention. Parts that are the same as in FIG. 4 are given the same numbers and are not described again except as needed for an understanding of the present embodiment. The read operation to eDRAM 44 is made using cache hit logic 50 which determines whether the desired information is indeed found in the cache and if so reads it out. If the information is not in the cache then the cache is not read and the logic typically finds the information elsewhere and carries out a cache load operation.

Cache write logic 52 writes data into the eDRAM 44. The flags to show that the time slot is available and not needed for a refresh are not shown. The write operation also includes setting a time stamp 54 for the data that is written. The data entry expires at the end of the duration indicated in the associated time stamp. It is noted that the time stamp may be used for additional purposes such as a data replacement policy.

In the cache implementation according to the present embodiments, the cache hit logic may additionally increment an activity counter 56 so that the use of the particular data item is recorded to show which data is frequently accessed. In addition or alternatively, the cache hit logic checks the time stamp 54. If the data is passed expiry then it is not used and a cache miss is indicated. If the data is close to expiry then refresh prioritizing logic 58 may be set to ensure that the data, apparently important since it is currently being accessed, is given priority in the refresh process. In embodiments the priority may only be set if the activity indication has reached a threshold level. Closeness to expiry may be determined by comparing the time remaining to a threshold. If the time remaining is lower than a threshold then the prioritizing logic is invoked and otherwise it is not.

The refresh controller may further control unnecessary refreshes by not refreshing data whose corresponding data timeout entry is less than or equal to the reciprocal of the refresh rate. That is to say the timestamp is less than a threshold, and the threshold is configured in relation to 1/r.

Figure 6:
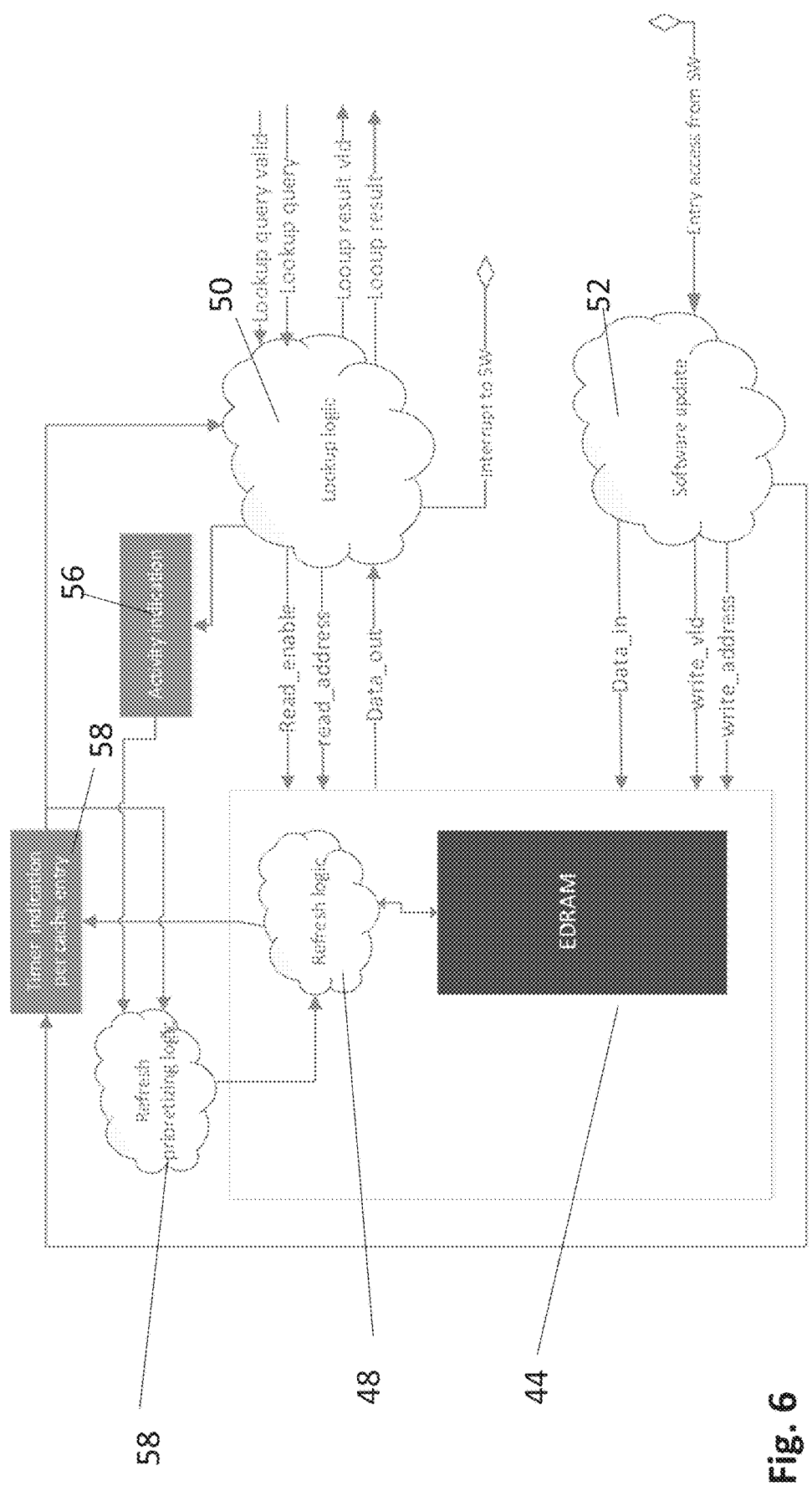
FIG. 6 is a simplified block diagram in which the eDRAM is used as a cache with a higher layer software supported structure such as a database, according to embodiments of the present invention.

Reference is now made to FIG. 6 which shows a variation of the embodiment of FIG. 5 in which a software or firmware layer manages the data entries. Thus for example the data entries are part of a configurable database where data entries which are currently or frequently required are held in cache which is provided by an eDRAM according to the present embodiments. Parts that are the same as in FIG. 4 are given the same numbers and are not described again except as needed for an understanding of the present embodiment.

The database is modified so data entries generally have short lifetimes or may automatically expire whenever the main database is updated or various other schemes may be used to keep the data current. Generally the database is managed by the software or firmware layer, herein referred to as the high level and the eDRAM management including regular refreshing forms the low level. Two examples of databases where the data entries have short lifetimes are: 1) a configurable database of IP address conversions to mac addresses and 2) a packet buffer which has a specified expiration time In general, the low level is left to manage the cache data entries including carrying out refreshes according to standard refresh procedures and the procedures of the present embodiments as outlined above.

However, at times the database is unavailable, say for example when the database is being updated under control of the high level. Nevertheless a cache data entry is approaching expiry and needs to be updated. The lookup or cache hit logic 50 for the read operation looks up the time stamp and if the data entry is set to expire and the database is unavailable, an interrupt may be set which tells the high level that a refresh is needed. The interrupt may thus cause the high level to manage a refresh of the expiring entry.

In greater detail, several methods are presented in order to ensure a required refresh rate, it being noted that the final clock rate of the ASIC in which the eDRAM is embedded may not be known at the time that the eDRAM part of the system is designed.

One solution involves increasing the clock frequency. The ASIC may have a standard clock rate for the memory bus of b, and the eDRAM may require a refresh rate of r. The eDRAM and memory bus may thus be run at a clock rate which is higher by $(b+r)/b$ than the nominal clock frequency of the ASIC. Such a clock rate may allow the refresh operations to occur without degrading the required memory access bandwidth.

In such a system, r clock cycles are reserved for the refresh mechanism and b cycles for the memory. Alternatively, the refresh may operate on a best effort basis and wait for non-active or empty slots.

For the best effort system, it is noted that the empty slots may arrive in bursts, that is lots of empty slots all at once and then a long period without. Such burstiness may be due to inaccuracies or internal limitations or due to the decimal fraction that r and b form together. Nevertheless it is advantageous that the refresh mechanism be able to work at any point in the clock cycle, and thus it is preferable that the refresh cycles are more evenly distributed.

In addition, the refresh operation has a strict condition on it, meaning that data has to be refreshed at certain intervals, otherwise the data becomes invalid. Furthermore b and r need not be products of one another, so that the fraction $(b+r)/b$ is not an exact number and an additional increase in the clock frequency may be required.

Thus it becomes necessary to support the refresh activities, hereinafter back pressure, within the eDRAM. The issue does not arise with SRAM memories where refresh is not used, so the memory access is guaranteed or may be based on a long round trip handshake, for example if the memory is in a shutdown state. Furthermore, in standard DRAM memories, where there is no embedding, the access rate is defined by the DRAM clock external memory which allows for any required refresh.

By contrast, with embedded DRAM the refresh rate requires a separate interface to the eDRAM on the ASIC. In an embodiment there may be numerous regions of eDRAM but all are managed through one wrapper, meaning a single refresh and clock system that governs all the eDRAM on the ASIC.

The idea of the single wrapper is that it is desirable to avoid having each eDRAM in a separate clock domain, say where there are several eDRAMs on a single chip.

In order to achieve a single overall wrapper, a tight handshake may be provided between the EDRAM and the requested access, and a wide variety of such handshakes are available. One of the present embodiments provides what may be termed a valid ready (vld-rdy) interface. Under the vld-rdy interface the EDRAM may raise a rdy signal on clocks when no refresh is being carried out. Then a new operation such as a memory read or write is only allowed when receiving a high rdy signal from the EDRAM. If no rdy signal is available then the time slot is reserved for a refresh.

In order to avoid timing issues, the rdy signal may be driven from a flip flop (FF) 22 whose states are driven by the modified clock, and not from combinational logic. In order to avoid timing issues and also in order to achieve an accurate refresh rate the eDRAM wrapper may hold two configurable registers: nominator and denominator which are configured with respect to r and to the internal clock frequency b. In addition the eDRAM holds a counter which is reduced by an amount equivalent to the nominator register for each clock cycle. When the counter reaches or passes zero, then the denominator value is added back to the counter and the cycle begins again.

Each time the counter reaches zero or below a refresh operation may be activated. Then the state of the counter in the following state, after the refresh, may trigger the rdy signal back again to allow standard operation. Such an embodiment may reduce timing issues and ensure that all necessary refreshes are in fact carried out.

Generally in memory structures such as caches and RAM, data is relatively shortlived. Most data times out, and often data has a defined timeout. For example Network devices such as switches or network adapters have data which has an expiration time. Two examples of explicitly expiring data are as follows:

A data buffer which is used to temporarily hold incoming or outgoing packets. In a typical network the data usually has an expiration time as defined in the specification relating to the particularly network, thus the Inifiniband specification for switch life time or the Ethernet specification.

Another exemplary use case is that of routing tables which have native aging and expiration. For example an IP router may be deleted if not accessed for a certain time.

In any cases of data with an explicit expiration time, the following rules may be applied according to the present embodiments.

1. Each entry which is accessed more often and is close to a timeout expiration may be assigned priority in the refresh mechanism.

2. In all cases where the data expiration time is smaller than 1/R then no refresh operation should actually be performed.

3. The device may treat the entry as if it does not exist if the refresh timeout has expired. Even if the refresh timer is smaller than the entry expiration timer but for some reason no refresh has been performed, the device may operate seamlessly with only a slight diversion from the required specifications.

Figure 7:
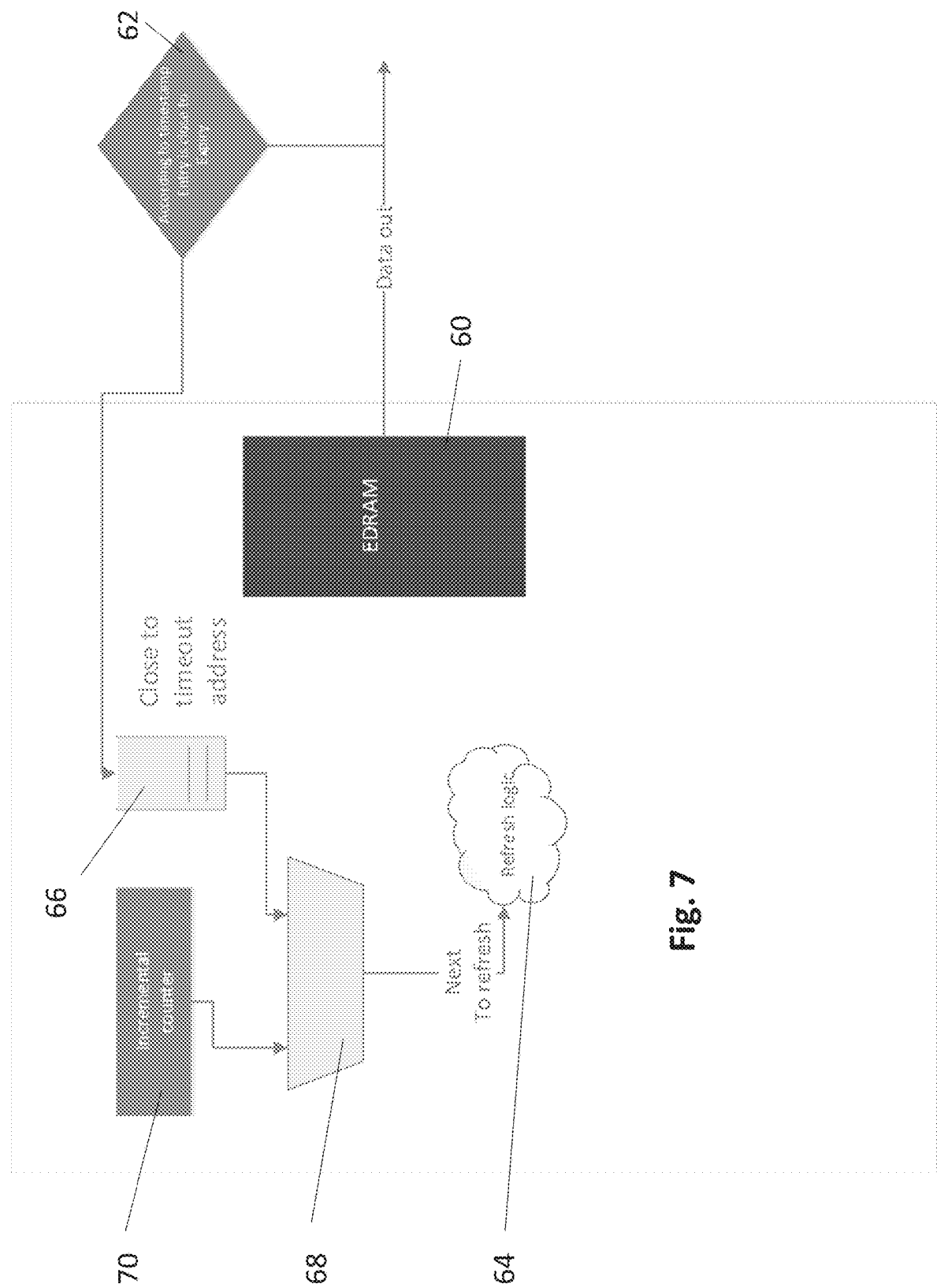
FIG. 7 is a simplified diagram showing in more detail the use of the eDRAM as a cache, with refresh prioritizing according to embodiments of the present invention.

Reference is now made to FIG. 7, which is a schematic diagram that illustrates in greater detail the embodiment in which eDRAM embedded on the integrated circuit is used as a data cache. The cache, as explained, contains intermediate information. Under a best effort policy of the refresh mechanism, say entering new data into empty slots without interfering with the memory access, it may be that some entries are not refreshed at the required time. Each entry may have several bits which indicate the last time the entry was written to the cache—either due to writing a new entry, updating an existing entry or due to the refresh mechanism. These bits may be coded in various ways. In one example a timestamp may be held in an associated on-chip SRAM. In another example some indicator bits may be held in flip flop or like circuitry either on or off the chip. Likewise other indications may be used.

FIG. 7 illustrates the data look up operation and shows how a data entry that is close to expiry may be added to the refresh queue for priority refresh. In order to access information, a lookup operation may find a particular data entry in the eDRAM cache 60 and also look for the associated timestamp entry. A lookup operation indicating a cache hit but showing the corresponding timestamp to have expired may return a cache miss indication and thus trigger a regular flow of cache loading. A cache hit showing a timestamp close to expiry may cause the corresponding data, presumably being data which is frequently required, to be given priority for refresh.

Such a refresh priority operation may thus be provided in order to reduce the probability of receiving a cache miss which is solely due to an expired timer.

In the mechanism the cache lookup reads the timer state as well as looking for the data, and, if the timer is close to expiration—box 62—a conventional eDRAM refresh is initiated using refresh logic 64 in order to avoid expiration of the refresh timer. This has the effect that for frequently accessed data, data expiry is prevented, and any frequently accessed data is refreshed before expiry but without touching the infrequently accessed data. Thus an improvement in overall performance is achieved.

As shown, the address of the data which is close to timeout—box 66—is added to a refresh queue 68, and the data at the front of the queue is the next to refresh when there is an available refresh slot. Incremental counter 70 may increment the refresh queue every time a refresh is carried out.

Such an additional mechanism may ensure that entries which are accessed more are less exposed to lack of refresh but the cache as a whole need not require the maximal refresh rate. Thus the refresh operations are optimized.

Returning to FIG. 6, and another application for the present embodiments relates to configurable databases. Network devices commonly incorporate configurable databases, and these configurable databases may be related to all kinds of required routing or header modifications that the packet may pass through.

At times the entire database may be occupied according to various scenarios and it is still required that the refresh rate is guaranteed for the working cache. If the refresh rate R is not guaranteed when the entire database is occupied or in other scenarios, it is possible to raise an interrupt to a higher layer (firmware or software or other) in order to reload and thus refresh the requested entry into the working cache. The request may be raised prior to but close to the expiration of the entry, and provided the interrupt precedes the expiration the cache refresh mechanism may be used. Thus the interrupt serves to give priority to the specific entry that is due to expire but already read information from the cache may be used in order to carry out the refresh.

On the other hand, once a database entry has actually expired then there is a delay until the higher level re-writes the entry. In that case, the sending of the response to the lookup request can be stalled until the rewrite occurs, or the request can be dropped altogether.

It is expected that during the life of a patent maturing from this application many relevant ASIC, SRAM, DRAM and eDRAM technologies and DRAM associated refresh technologies will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. An apparatus comprising:
    an integrated circuit including:
        at least one block of dynamic random access memory (DRAM), requiring refresh at a given refresh rate r;
        a processor;
        a data bus connecting the processor to the at least one block of DRAM; and
        a refresh controller configured to refresh the at least one block of DRAM over the data bus, the refresh controller configured to control clocking of the data bus,
        wherein data entries are stored in said embedded dynamic random access memory and each data entry is associated with a corresponding data timeout,
        wherein said embedded dynamic random access memory is a data cache, configured such that a data lookup that finds a data entry in said embedded dynamic random access memory also looks at the corresponding data timeout entry,
        wherein said data cache associated with a configurable database, and data entries therein are database entries of said configurable database, and
        further comprising an interrupt, the interrupt for assertion when a database entry in said cache approaches a timeout and a reserved refresh slot is not available, assertion of the interrupt causing a refresh of said entry.

2. The apparatus of claim 1, wherein said refresh controller is configured to receive an indication of a data-bus bandwidth b for which the processor was designed and to clock the data bus at a rate suitable to accommodate both the bandwidth b for operation of the processor and refresh of the DRAM at the given refresh rate.

3. The apparatus of claim 2, wherein said bandwidth b is variable or is unknown at a time of design of the apparatus.

4. The apparatus of claim 1, wherein said refresh controller is configured to set and reset a flag that indicates clock cycles in which the data bus is reserved for use by the refresh controller.

5. The apparatus of claim 4, wherein said refresh controller is configured to set the flag at a plurality of times distributed over a time period in which the DRAM requires refresh according to the refresh rate.

6. The apparatus of claim 4, wherein the processor is configured to access the at least one block of DRAM only when said flag is not set.

7. The apparatus of claim 4, wherein said refresh controller comprises a flip flop having an output state, said flag being set according to said output state.

8. The apparatus of claim 1, wherein the refresh controller is configured to prioritize any data entry found for refreshing wherein said corresponding data timeout entry indicates that said data entry is closer than a predetermined threshold to timing out.

9. The apparatus of claim 1, wherein said refresh controller is configured to ignore any data entry for refresh whose corresponding data timeout entry is less than or equal to $1/r$.

10. The apparatus of claim 1, wherein said refresh controller is configured not to carry out a refresh for any data entry wherein said data timeout entry is smaller than said refresh rate.

11. The apparatus of claim 1, wherein the processor is configured to initiate an interrupt which causes the refresh controller to refresh a data entry in the at least one block of DRAM, in response to a determination that the data entry is approaching expiry.

12. The apparatus of claim 1, wherein the refresh controller is configured to identify empty slots on the bus and use the identified empty slots for refresh of the at least one block of DRAM.

13. The apparatus of claim 1, wherein the least one block of DRAM comprises a plurality of DRAM regions, which are all governed by the refresh controller which governs the plurality of DRAM regions from a single wrapper.

14. The apparatus of claim 1, wherein the refresh controller comprises a refresh queue and is configured to refresh memory locations indicated in the refresh queue before refreshing other memory locations.

15. Apparatus comprising:
    at least one block of dynamic random access memory embedded on an integrated circuit alongside a processor and a data bus, the data bus having a bandwidth b in bus clock cycles for a given period at a given rate for required memory access, the at least one block of dynamic random access memory further requiring data refresh at a refresh rate r in bus clock cycles at said given rate; and a refresh controller, the refresh controller configured to control refresh by clocking the data bus at a rate higher than said given rate to accommodate both said required memory access and said required data refresh within said given period;

wherein said refresh controller is configured to set and reset a flag such that said reserving clock cycles comprises setting a flag over r of cycles of the given period, wherein said refresh controller is configured to carry out division of said refresh rate by a sum of said refresh rate and said bandwidth to identify clock cycles for setting said flag, and wherein the apparatus further comprises a first register storing r and a second register storing b+r and a counter configured to successively subtract r from b+r until reaching or exceeding zero, the apparatus configured such that upon said counter reaching or exceeding zero, a refresh is carried out, said flag is set and b+r is added to said counter.

16. An apparatus comprising:
at least one block of embedded dynamic random access memory (eDRAM) and application specific logic integrated together alongside a data bus such that said eDRAM, said databus and said application specific logic are integrated together on an integrated circuit, the at least one block of dynamic random access memory further requiring data refresh; and
a refresh controller for controlling said data refresh,
wherein data entries are stored in said eDRAM and each data entry is associated with a data timeout entry, the apparatus configured such that a data lookup operation that finds a data entry in said eDRAM also looks at the corresponding data timeout entry, and
wherein the application specific logic is configured to indicate to the refresh controller data entries in the eDRAM to be refreshed, responsive to the corresponding data timeout entries,
the refresh controller being configured to control refresh by prioritizing any data entry found for refreshing if said corresponding data timeout entry indicates that said data entry is closer than a predetermined threshold to timing out.

17. An apparatus comprising:
an integrated circuit including:
at least one block of dynamic random access memory (DRAM), requiring refresh at a given refresh rate r;
a processor;
a data bus connecting the processor to the at least one block of DRAM; and
a refresh controller configured to refresh the at least one block of DRAM over the data bus, the refresh controller configured to control clocking of the data bus,
wherein said refresh controller is configured to receive an indication of a data-bus bandwidth b for which the processor was designed and to clock the data bus at a rate suitable to accommodate both the bandwidth b for operation of the processor and refresh of the DRAM at the given refresh rate, and
wherein said refresh controller is configured to clock the data bus at a rate of b+r slots per unit time, where (b+r)/b is not an integer.

18. The apparatus of claim 17, wherein data entries are stored in said embedded dynamic random access memory and each data entry is associated with a corresponding data timeout.

19. The apparatus of claim 18, wherein said embedded dynamic random access memory is a data cache, configured such that a data lookup that finds a data entry in said embedded dynamic random access memory also looks at the corresponding data timeout entry.

20. An apparatus comprising:
an integrated circuit including:
at least one block of dynamic random access memory (DRAM), requiring refresh at a given refresh rate r;
a processor;
a data bus connecting the processor to the at least one block of DRAM; and
a refresh controller configured to refresh the at least one block of DRAM over the data bus, the refresh controller configured to control clocking of the data bus,
wherein the refresh controller comprises a refresh queue and is configured to refresh memory locations indicated in the refresh queue before refreshing other memory locations, and
wherein the processor comprises prioritizing logic configured to add to the refresh queue memory locations identified as being close to expiration.

21. The apparatus of claim 20, wherein the prioritizing logic is configured to identify memory locations close to expiration, to consult a corresponding activity indication of the identified memory locations, and to add to the refresh queue, only memory locations having a corresponding activity indication above a threshold.

* * * * *